(12) United States Patent
Perna

(10) Patent No.: US 8,242,454 B2
(45) Date of Patent: Aug. 14, 2012

(54) SCINTILLATOR AND METHODS OF MAKING AND USING SAME

(75) Inventor: Louis Perna, Elyria, OH (US)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 469 days.

(21) Appl. No.: 12/473,719

(22) Filed: May 28, 2009

(65) Prior Publication Data

US 2009/0294682 A1  Dec. 3, 2009

Related U.S. Application Data

(60) Provisional application No. 61/057,389, filed on May 30, 2008, provisional application No. 61/057,411, filed on May 30, 2008.

(51) Int. Cl.
  *G01T 1/164*  (2006.01)
  *G01T 1/20*  (2006.01)
(52) U.S. Cl. ....................................................... 250/367
(58) Field of Classification Search .................. 250/367
  See application file for complete search history.

(56) References Cited

U.S. PATENT DOCUMENTS

| | | | |
|---|---|---|---|
| 4,870,279 A * | 9/1989 | Cueman et al. | 250/368 |
| 5,418,377 A * | 5/1995 | Tran et al. | 250/483.1 |
| 5,869,836 A | 2/1999 | Linden et al. | |
| 6,222,192 B1 | 4/2001 | Sekela et al. | |
| 6,359,282 B1 | 3/2002 | Sekela | |
| 6,362,479 B1 | 3/2002 | Andreaco et al. | |
| 6,881,960 B2 | 4/2005 | Schreiner et al. | |
| 6,909,097 B2 | 6/2005 | Schreiner et al. | |
| 7,037,640 B2 * | 5/2006 | Koninckx et al. | 430/496 |
| 7,138,633 B1 | 11/2006 | Rozsa et al. | |
| 7,375,341 B1 * | 5/2008 | Nagarkar et al. | 250/370.11 |
| 2007/0007460 A1 | 1/2007 | Hochstetler et al. | |
| 2009/0065700 A1 | 3/2009 | Menge et al. | |
| 2009/0236534 A1 | 9/2009 | Selfe et al. | |
| 2009/0261262 A1 | 10/2009 | Hunt | |
| 2009/0294683 A1 | 12/2009 | Perna | |
| 2010/0148074 A1 | 6/2010 | Menge et al. | |
| 2010/0155610 A1 | 6/2010 | Menge et al. | |

* cited by examiner

*Primary Examiner* — Constantine Hannaher

(74) *Attorney, Agent, or Firm* — Abel Law Group, LLP; Christopher J. Cianciolo

(57) ABSTRACT

A scintillation array and methods of making and using are provided. The array may be a flexible array that can be arranged into two or more flexible configurations. The array may be positioned around a portion of an object so that the array pixels are equidistant from the center or surface of the object.

22 Claims, 3 Drawing Sheets

SCINTILLATOR AND METHODS OF MAKING AND USING SAME

CROSS-REFERENCE TO RELATED APPLICATION

This application claims the benefit of U.S. Provisional Patent Application Ser. No. 61/057,411 filed on May 30, 2008. This application also claims the benefit of U.S. Provisional Patent Application Ser. No. 61/057,389 filed on May 30, 2008. The disclosures of both are fully incorporated herein by reference.

TECHNICAL FIELD

The present invention relates to radiation detectors and more particularly, to scintillation arrays and methods of making and using scintillation arrays.

BACKGROUND INFORMATION

Scintillation detectors are generally used to detect radiation that is not easily detected by conventional photodetectors. A scintillator, or scintillation crystal, absorbs ionizing radiation and converts the energy of the radiation to a light pulse. The light may be converted to electrons (i.e., an electron current) with a photodetector such as a photodiode, charge coupled detector (CCD) or photomultiplier tube. Scintillation detectors may be used in various industries and applications including medical (e.g., to produce images of internal organs), geophysical (e.g., to measure radioactivity of the earth), inspection (e.g., non-destructive, non-invasive testing), research (e.g., to measure the energy of photons and particles), and health physics (e.g., to monitor radiation in the environment as it affects humans).

Scintillation detectors typically include either a single large crystal or a large number of small crystals arranged in a planar array. Many radiation scanning instruments include scintillation detectors that comprise pixelated arrays of scintillation crystals. Arrays can consist of a single row of adjoining crystal pixels (linear array) or multiple rows and columns of adjoining crystal pixels (2-D array). Linear and 2-D arrays can include thousands of crystal pixels and the system may be constructed and arranged so that an emission from each pixel can be individually detected by a photodetector.

SUMMARY

In one aspect a scintillation array is provided, the array comprising a plurality of scintillation pixels joined flexibly together wherein the array is constructed and arranged to be flexible between a planar array and an array having a curvature radius of less than 50 cm.

In another aspect a scintillation array is provided, the array comprising a plurality of scintillators joined flexibly together, the array capable of being placed in both a first arrangement wherein the scintillators are in the same x-y plane and in a second arrangement wherein at least some of the scintillators are not in the same x-y plane.

In another aspect a method of making a scintillation array is provided, the method comprising arranging a plurality of scintillation crystals in a pattern, flooding the plurality of scintillation crystals with a polymer, curing the polymer to fix the array in a first configuration and bending the array into a second configuration.

In another aspect a method of making a scintillation array is provided, the method comprising cutting a first series of channels along a first series of parallel planes into the surface of a substrate, at least partially filling the channels with a flexible adhesive, and cutting a slice perpendicular to the first series of parallel planes to produce a flexible scintillation array.

In another aspect a system is provided, the system comprising an ionizing radiation source, a pixelated scintillation crystal array, and a photodetector wherein the system is constructed and arranged to operate in first and second configurations wherein the pixelated scintillation crystal array has a first curvature radius in the first configuration and a different second curvature radius in the second configuration.

BRIEF DESCRIPTION OF THE DRAWINGS

These and other features and advantages will be better understood by reading the following detailed description, taken together with the drawings wherein.

DETAILED DESCRIPTION

Figure 1:
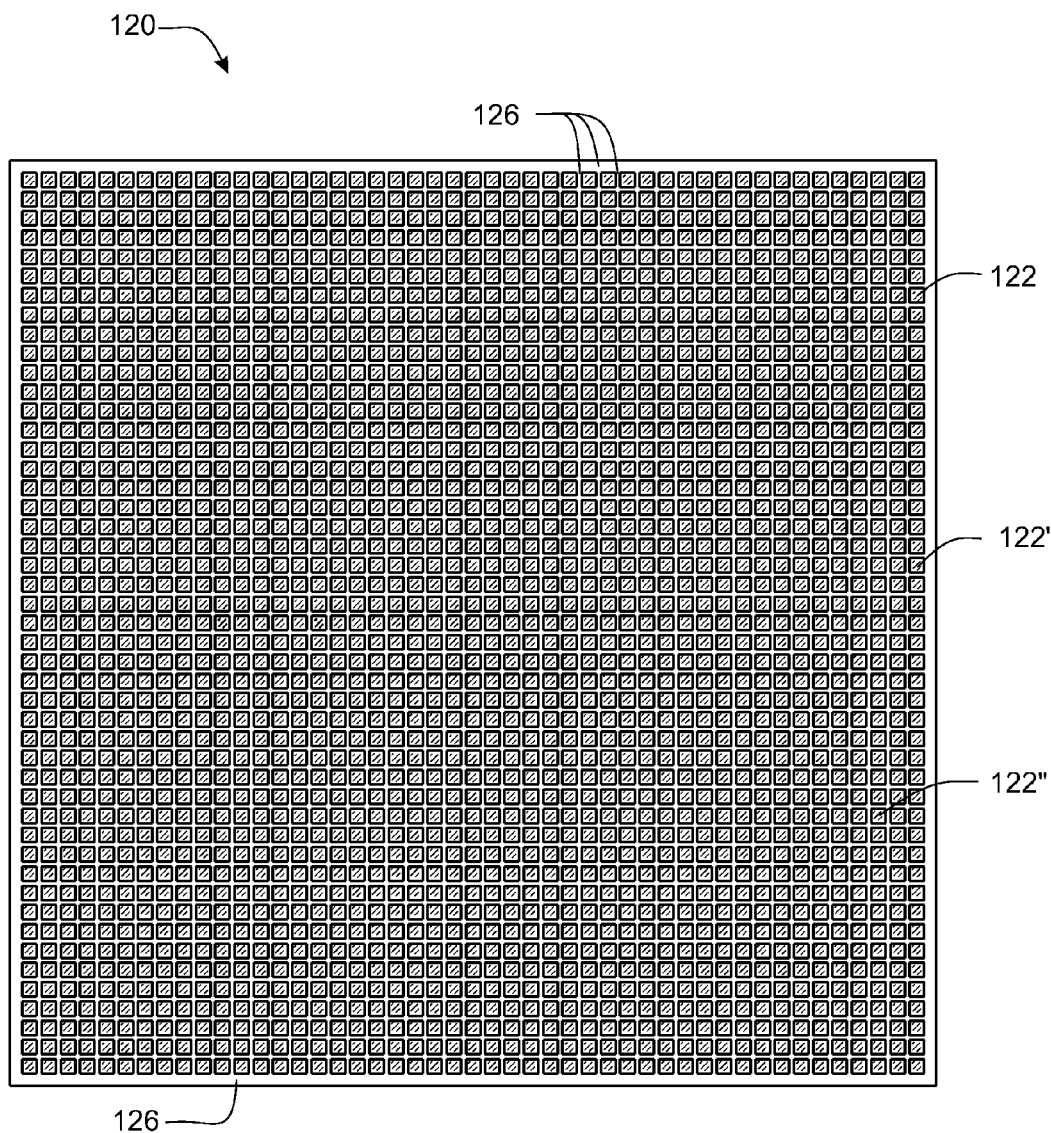
FIG. 1 is a plan view of one embodiment of a two dimensional scintillation array.

As used herein, the term "radiation" includes ionizing electromagnetic radiation and high-energy particles (e.g., gamma radiation, alpha particles and beta particles). The term "light" includes electromagnetic radiation of any wavelength and is not limited to visible light. "Detectable light" is the light output by a scintillator that can be detected by a photodetector. The term "scintillator" refers to a material that emits light ("scintillation light") in response to electromagnetic radiation incident thereon ("excitatory radiation"). Known scintillators include materials such as ceramic, crystal and polymer scintillators. A "scintillation crystal" is a scintillator made primarily of inorganic crystal. "Scintillation pixels" are known to those of skill in the art and comprise individual scintillators that are each detectable using a photo sensor. Multiple scintillation pixels can be associated together to form a "scintillation array." A "planar array" is an array in which all of the pixels of the array lie in a common plane. A "flexible array" is a scintillation array that can be flexed, without incurring substantial damage, from a planar position to a curved position having a radius of curvature of less than 50 cm. A "photodetector" converts detectable light emitted from a scintillation crystal into an electrical signal. The term "optically coupled" refers to at least one coupled element being adapted to impart light to another coupled element directly or indirectly. An "adhesive" as used herein is any material that can be used to join independent pixels together in an array.

In one aspect, a flexible scintillation array can be produced and formed into different shapes. The array may be a two dimensional array that includes rows and columns of scintillation pixels. The array can be formed in a planar configuration and can be manipulated into other shapes such as cylinders, cones, and partial cylinders and cones. The scintillation pixels may be flexibly joined together and may include spaces there between. The pixels may be joined together by an adhesive such as a flexible polymer. By bending the array into a partial cylinder or other non-planar shape the individual pixels in the array can be positioned equidistant, or almost equidistant, from a non-planar object or subject that is being scanned. If the pixels in the array are substantially equidistant from the object, the resulting image may be subject to less distortion, resulting in an improved image. The array may be attached to, or aligned with, a series of photodetectors that can be shaped and/or positioned to complement the curvature of the scintillation array. In this manner, each photodetector may also be positioned equidistant from a corresponding scintillation pixel.

A flexible array capable of being adjusted to a variety of curvatures can be used in different applications that may demand or benefit from variable curvatures. A single array can be produced in bulk and can be manipulated for a specific end use after the end use has been determined. Furthermore, if an instrument should call for an array having an adjustable curvature, the curvature radius of the array can be infinitely adjusted and may be changed multiple times before and/or after installation in an instrument.

An array can include a plurality of scintillation pixels that may be of any material capable of converting radiation to detectable light. The pixels may be crystalline and may be obtained from separate sources or from a common crystalline monolith. To divide the monolith into individual pixels, channels may be cut into the crystal using techniques known to those of skill in the art. These cutting methods include, for example, wire saws, OD saws, ID saws and lasers. The resulting channels may then be filled with an adhesive (including adhesive precursors such as prepolymers) after which complete arrays may be sliced from the monolith to provide multiple arrays from a single monolith crystal.

In various embodiments the flexible array may be either a one dimensional array or a two dimensional array (2-D Array). A one dimensional array includes a single row of scintillation crystals. A two dimensional array includes both rows and columns of scintillation crystals, and can include rows and columns of any number of scintillation pixels. A "two dimensional array" is not limited to a planar array but can include three dimensional shapes such as cylinders and partial cylinders. Columns and/or rows may include more than 1, more than 10, more than 50, more than 100 or more than 500 pixels. The pixels may comprise a crystal including, for example, cesium iodide (CsI), thallium doped cesium iodide (CsI(Tl)), bismuth germanate (BGO), thallium doped sodium iodide (NaI(Tl)), barium fluoride ($BaF_2$), europium doped calcium fluoride ($CaF_2(Eu)$), cadmium tungstate ($CdWO_4$), cerium doped lanthanum chloride ($LaCl_3(Ce)$), cerium doped lutetium yttria silicates ($LuYSiO_5(Ce)$), silver doped zinc sulfide (ZnS(Ag)), yttrium aluminum garnet ($Y_3Al_5O_{12}(Ce)$) and/or $LaBr_3(Ce)$. Crystals may be polycrystalline or single crystal in nature. The incident face of the pixels may be of any appropriate shape including square or polygonal. The pixels may be cuboid in shape and sized in the x, y and z (x-ray depth) dimensions to match the requirements of the instrument with which the array is used. For instance, the crystal may have x and/or y dimensions of between 0.1 and 5.0 mm including 0.33, 0.5, 1.0, 1.5 and 2.0 mm. The x-ray depth can be chosen so as to not restrict the flexibility of the array yet still provide adequate scintillation of incident ionizing radiation. In some embodiments, this means an x-ray depth of less than or equal to 2 mm, 1 mm, 0.8 mm or 0.5 mm. The spacing between the scintillation pixels can be chosen to optimize resolution and flexibility. In some embodiments the spacing between pixels, which may be constant across the array, can be in the range of 0.05 to 1.0 mm including 0.25 and 0.5 mm. The arrays described herein may be used with radiation sources of, for example, less than 700 keV, less than 500 keV, less than 300 keV, or less than 200 keV.

Figure 2:
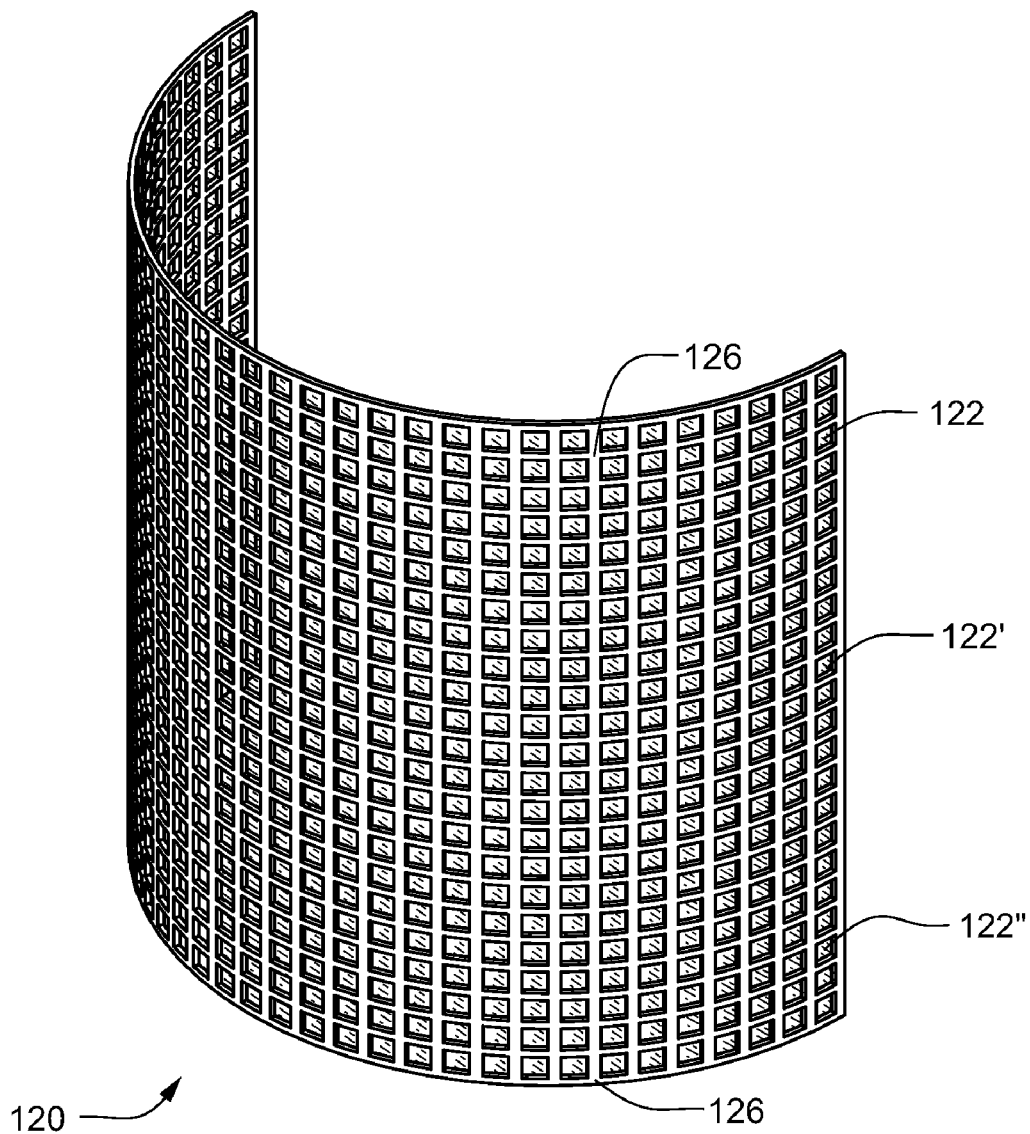
FIG. 2 is a perspective view of one embodiment of a flexible array that has been curved into a partial cylinder.

A plan view of a section of a flexible array 120 is provided in FIG. 1. The pixels 122 of the array may be joined together by a flexible adhesive such as a flexible polymer 126. The flexible material may allow for flexing of the array from a planar to a partially cylindrical shape such as the half cylinder illustrated in FIG. 2. In some embodiments, the array can be flexed both upwardly and downwardly with reference to the plane in which it is shown in FIG. 1. Bending may occur around an axis parallel to either the rows or columns of pixels in the array. In this case, either the rows or columns of pixels may be parallel with the axis of the curved array. Other embodiments may be curved along axes that are not parallel with the pixels. An array may be flexed, for example, to a radius of less than 50 cm, less than 20 cm, less than 10 cm, less than 5 cm, less than 2.5 cm or to an infinite number of radii between 2.5 and 100 cm, or greater. The radius of the array may also be set to be equivalent or substantially equivalent to a distance equal to the distance from the center of the object being scanned to the incident surface of the scintillation pixels. In another embodiment the radius of curvature of the array may be adjusted to be equal to the distance from the x-ray source to the scintillation pixels of the array. The flexible adhesive between the pixels may be an elastomer or other organic or inorganic polymer. For instance, the adhesive may be one or more of epoxy, acrylic, polyurethane, cyanoacrylate, silicone, hot melts and water based adhesives, for example. The adhesive may be cured, for instance, by chemical, temperature or radiation (UV, visible) catalysis. The adhesive may be reflective or may contain an additive, such as a pigment, to improve reflectivity. One white pigment shown to provide good reflectivity in some embodiments is titanium dioxide ($TiO_2$). More than one adhesive may be used in an array. For example, an array may include both a reflective and a non-reflective polymer. In some embodiments, the adhesive may have a flexural modulus (ASTM D 790) of less than $1 \times 10^7$ psi, less than $1 \times 10^6$ psi, less than $1 \times 10^5$ psi or less than $1 \times 10^4$ psi.

Figure 3:
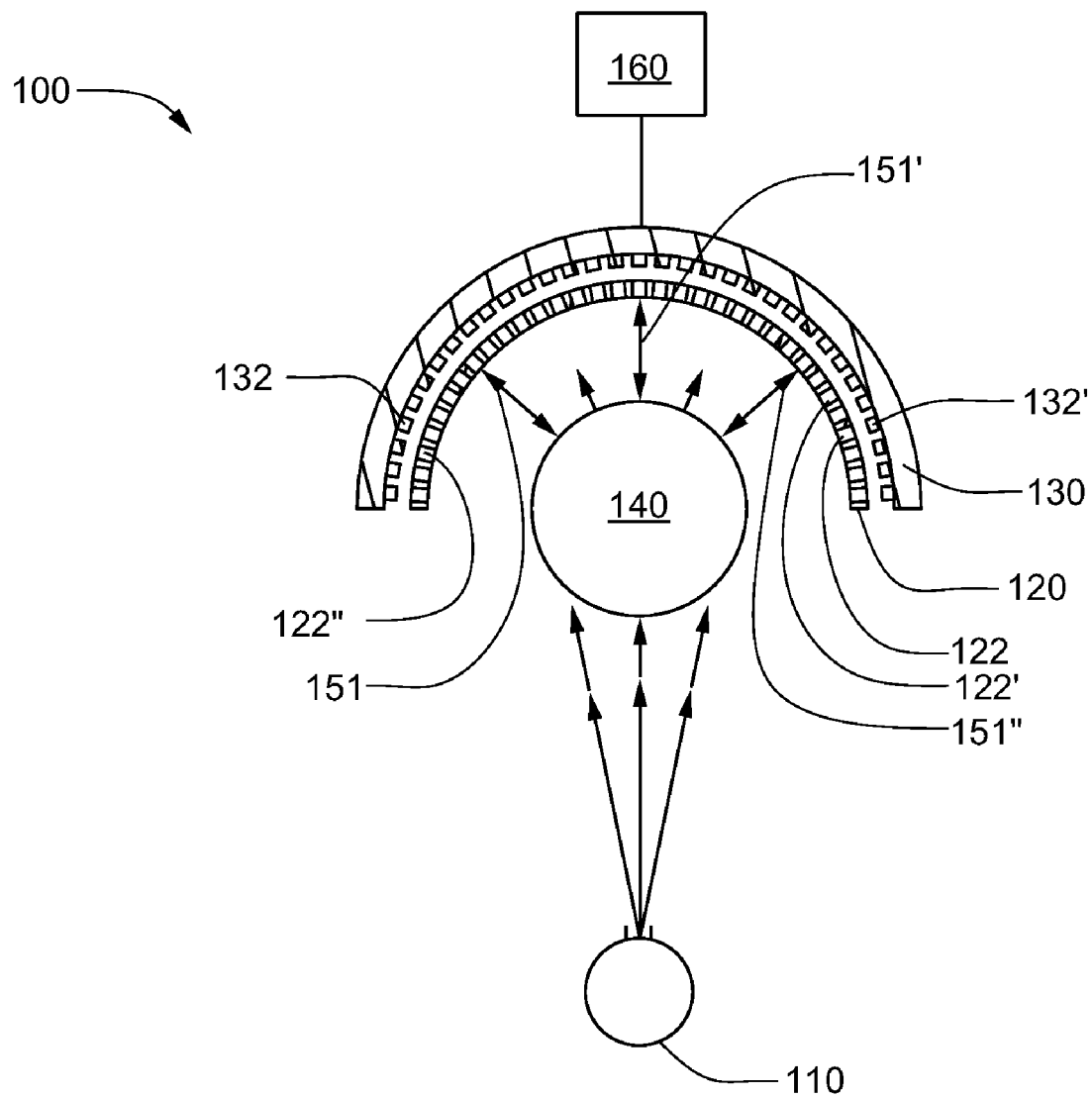
FIG. 3 is a schematic of one embodiment of an instrument including a flexible scintillation array.

A schematic diagram providing a cross-sectional view of an instrument 100 using a flexible scintillation array is provided in FIG. 3. The instrument may be, for example, a CT scanner, PET scanner or geotechnical scanner. X-ray tube 110 emits radiation that may be collimated and directed toward object or subject 140. Object 140 can be substantially cylindrical as shown in the figure. Flexible scintillation array 120 has been curved to place the individual pixels 122, 122' and 122" equidistant from subject 140. Therefore, distances represented by 151, 151' and 151" may all be equal. Radiation passing through subject 140 can impact pixels 122, 122' and 122" normally to the pixels' incidental surfaces and parallel with their z axes (x-ray depth). Array 120 is optically coupled to photodiodes 132, 132', etc. which are mounted on photodetector support 130 and correspond one-to-one with each of pixels 122. Detectable light from the scintillation array is converted to electrical impulses by the photodiodes and subsequently processed downstream by signal processing system 160.

Signal processing system 160 may be coupled to photodetector 130 of system 100 to process the electrical output from the photodetector 130 and produce detected radiation event information. The signal processing system 160 may include electronic circuits, devices or equipment that receive, analyze, and/or process the electrical output from the photodetector 130. In an embodiment, for example, signal processing system 160 may include one or more amplifiers that collect the charge outputs from the detection devices or regions of the photodetector 130 and generate corresponding voltage pulses. The signal processing system 160 may also include a multi-channel analyzer to measure the voltage pulses and store counts corresponding to the measured voltage pulses (i.e., counts per channel). The signal processing system 160 may further include data processing circuitry and/or software to process the voltage pulses and/or stored counts, for example, by computing centroids of the detected events represented by the voltage pulses and/or counts and by producing images representing detected events using positioning techniques, such as Anger logic, which are generally known to those skilled in the art.

A set of identical flexible scintillation arrays was produced as follows. A monolith crystal of CsI(Tl) 10 cm x) by 10 cm (y) by 1.5 cm thick (z) was used as a substrate to provide a plurality of identical arrays of scintillation pixels. Using a multi-wire diamond wire saw, parallel channels were cut down the z axis (x-ray depth) along the y direction until the wires were within about 3 mm of the bottom surface of the crystal. The wires had a diameter of about 0.25 mm and were spaced to produce crystal strips about 1 mm wide. The crystal was then rotated 90 degrees in relation to the saw and the channeling process was repeated, resulting in a square matrix of 1 mm by 1 mm pixels separated by channels about 0.25 mm wide. At this stage, all the pixels were still integral to the uncut bottom layer of crystal substrate.

After cutting was complete, the channels were filled with an adhesive chosen to provide adequate flexibility in a finished array. In this case, the adhesive was a flexible epoxy from Emerson Cummings sold as ECCOBOND. Specific mix ratios of this epoxy may be chosen to provide preferred levels of flexibility. $TiO_2$ pigment was added into the adhesive mix. After the adhesive had set, the crystal was secured with the z axis oriented vertically and multiple arrays were sliced from the crystal by cutting along the x-y plane, releasing the pixels from the substrate. Each resulting sheet, or array, was about 1 mm thick. Accounting for the thickness of the kerf, 10 arrays were cut from the crystal, each having about 100 rows and 100 columns of pixels measuring 1 mm by 1 mm square and having an x-ray depth of about 1 mm. In this particular embodiment, cutting to an x-ray depth of 1 mm or less, the array is flexible enough to be curved to a radius down to about 2.5 cm, or less. An array capable of flexing to a radius of curvature of less than 50 cm, less than 25 cm or less than 10 cm, for example, may be useful in scanning objects that present a generally cylindrical shape. Such objects may include, for example, pipes and conduits as well as limbs, torsos and heads of human and animal subjects. A single flexible array may be used in a variety of scanning instruments that otherwise would require different pre-made arrays of specific curvature.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one." The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified, unless clearly indicated to the contrary.

All references, patents and patent applications and publications that are cited or referred to in this application are incorporated in their entirety herein by reference.

What is claimed is:

1. A scintillation array comprising:
a plurality of individual scintillation pixels joined flexibly together to form the array, wherein the array is constructed and arranged to be flexible between a planar array and an array having a curvature radius of less than 50 cm and wherein the array is formed from a first row of the individual pixels and at least one other row of the individual pixels that is parallel to the first row and flexibly joined thereto, wherein each adjacent pair of pixels is separated by a channel that is at least partially filled with a flexible adhesive.

2. The scintillation array of claim 1 wherein at least a portion of the array can be flexibly arranged to include a curvature radius of less than 20 cm.

3. The scintillation array of claim 1 wherein the array comprises at least two portions having differing radii of curvature.

4. The scintillation array of claim 1 including pixels having x-ray depths of less than or equal to 1 mm.

5. The scintillation array of claim 1, wherein opposite sides of the pixels are exposed.

6. The scintillation array of claim 1 wherein the flexible adhesive comprises a flexible polymer.

7. The scintillation array of claim 6 wherein the adhesive comprises a flexible epoxy.

8. The scintillation array of claim 6 wherein the adhesive comprises a reflective additive.

9. The scintillation array of claim 1 wherein the pixels are comprised of CsI(Tl).

10. The scintillation array of claim 1 wherein the pixels are formed from a crystal monolith.

11. A scintillation array comprising:
a plurality of individual scintillators joined flexibly together by only a shared adhesive filler, the array capable of being placed in both a first arrangement wherein the scintillators are in the same x-y plane and in a second arrangement wherein at least some of the scintillators are not in the same x-y plane, wherein opposing sides of the scintillators are exposed.

12. The array of claim 11 wherein the scintillators are in the form of a two dimensional array having rows and columns and wherein the scintillators within a row have parallel x-ray depth axes and the scintillators within a column do not.

13. The array of claim 11 wherein the array is a linear array.

14. The array of claim 11 wherein the array is a two dimensional array.

15. A method of making a scintillation array comprising:

cutting a first series of channels with a wire saw in a substrate having an x-, y-, and z-axis, the first series of channels cut along a first series of planes parallel to the z-axis;

at least partially filling the channels with a flexible adhesive and a reflective additive; and cutting a slice perpendicular to the z-axis through the first series of planes parallel to the z-axis to produce a flexible scintillation array in which each adjacent pair of pixels is separated by a channel that is at least partially filled with the flexible adhesive.

16. The method of claim 15 further comprising cutting a second series of channels along a second series of planes parallel to the z-axis and perpendicular to the first series of channels.

17. The method of claim 15 wherein the first series of parallel planes is perpendicular to the surface of the substrate.

18. The method of claim 15 wherein the channels are cut less than completely through the substrate.

19. The method of claim 15 further comprising curving the flexible array from an original orientation to a radius of less than 50 cm.

20. The method of claim 19 further comprising curving the flexible array back to the original orientation.

21. The method of claim 15 wherein the substrate comprises a crystal monolith.

22. An instrument, comprising:
a photodetector; and
a scintillation array according to claim 1 coupled to the photodetector.

* * * * *